(12) United States Patent
Cheng et al.

(10) Patent No.: US 9,461,013 B2
(45) Date of Patent: Oct. 4, 2016

(54) WIRE SPOOL SYSTEM FOR A WIRE BONDING APPARATUS

(71) Applicants: Chi Wah Cheng, Tsing Yi (HK); Hon Kam Ng, Tsing Yi (HK)

(72) Inventors: Chi Wah Cheng, Tsing Yi (HK); Hon Kam Ng, Tsing Yi (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 14/549,771

(22) Filed: Nov. 21, 2014

(65) Prior Publication Data

US 2016/0148898 A1    May 26, 2016

(51) Int. Cl.
| | | |
|---|---|---|
| *H01L 23/00* | (2006.01) | |
| *B65H 63/06* | (2006.01) | |
| *B65H 51/02* | (2006.01) | |
| *B65H 51/20* | (2006.01) | |
| *B65H 59/00* | (2006.01) | |

(52) U.S. Cl.
CPC ............... *H01L 24/78* (2013.01); *B65H 51/02* (2013.01); *B65H 51/20* (2013.01); *B65H 59/00* (2013.01); *B65H 63/06* (2013.01); *H01L 2224/7855* (2013.01); *H01L 2224/78601* (2013.01); *H01L 2224/78611* (2013.01); *H01L 2224/78901* (2013.01)

(58) Field of Classification Search
CPC ....... H01L 24/78; B65H 63/06; B65H 51/02; B65H 51/20; B65H 59/00
See application file for complete search history.

(56) References Cited

U.S. PATENT DOCUMENTS

| | | | | |
|---|---|---|---|---|
| 4,671,446 | A * | 6/1987 | Sherman | ............... 228/4.5 |
| 2007/0187470 | A1* | 8/2007 | Tei | ............... B23K 20/004 |
| | | | | 228/180.5 |
| 2011/0186220 | A1* | 8/2011 | Ahn et al. | ............... 156/297 |

* cited by examiner

*Primary Examiner* — Long Pham
(74) *Attorney, Agent, or Firm* — Ostrolenk Faber LLP

(57) ABSTRACT

Disclosed is a wire spool system for a wire bonding apparatus, comprising: a wire reel arranged to receive a wire; a wire guide for feeding a free end of the wire to a bond head of the wire bonding apparatus; and a tensioning mechanism for tensioning the wire to define a wire path between the wire reel and the wire guide. The wire spool system comprises an imaging module comprising a camera having an image sensor. The imaging module also comprises an image processing unit. The camera is positioned to image, by said image sensor, at least a portion of the wire path to generate image data. The image processing unit is configured to process the image data to determine a geometry and/or a change in geometry of the at least a portion of the wire path.

6 Claims, 3 Drawing Sheets

WIRE SPOOL SYSTEM FOR A WIRE BONDING APPARATUS

BACKGROUND

The present invention relates to the field of semiconductor assembly and packaging, and in particular to a wire spool system for a wire bonding apparatus.

Wire bonders are used during semiconductor assembly and packaging for making electrical interconnections between electrical contact pads on a semiconductor die and a substrate, or between electrical contact pads on different semiconductor dies. Wire is fed from a wire spool containing bonding wire to a bonding tool such as a capillary for performing wire bonding.

A typical method used to bond or weld the wire to a connection pad is through a combination of heat, pressure and/or ultrasonic energy. It is a solid phase welding process, wherein the two metallic materials (the wire and the pad surface) are brought into intimate contact. Once the surfaces are in intimate contact, electron sharing or inter-diffusion of atoms takes place, resulting in the formation of a wire bond. The two main types of wire bond are ball bonds and wedge bonds.

For example, a wedge bonder bonds wires using ultrasonic energy generated by an ultrasonic transducer. The transducer produces ultrasonic oscillations. The oscillations pass through a wedge at a bond head of the wedge bonder, and are transmitted to the bonding wire underneath the wedge.

The bonding wire is fed out from the wire reel by the wire spooling system. A known wire spool is shown in FIG. 1. The wire spool usually comprises the following features: a spool shaft 101 which holds the wire reel, a tensioner 102 to preload the wire feeding out from the reel, a wire buffer region 103 to maintain a consistent feed of the bonding wire, a wire path 104 for feeding the bonding wire to the bond head, and a wire loss detector 105 which detects the wire movement after bonding in order to determine whether or not the bond has stuck.

The sticking of the bond can be determined by the wire loss detector 105 through detecting the movement of the bonding wire. Normally after a successful bond, the bond head will move up and the bonding wire will pay out from the bond tip for further processing such as looping and cutting. The amount of the wire pay out can be determined at the exit of the wire spool. If the amount is larger than a predetermined threshold, the bond can be treated as a stuck bond.

There are two types of wire loss detectors: contact and non-contact type. An example of a contact type detection mechanism is shown in FIG. 2. The contact type detection mechanism comprises a rotary encoder 201 operatively coupled to a pair of clamping rollers 202. The clamping rollers grip the bonding wire 203 in between to provide a frictional contact. When the wire 203 is fed, the rollers 202 will be rotated and hence the rotary encoder 201 will be able to record a signal representative of the length of wire which has been paid out.

An example of a non-contact wire loss detector is shown in FIG. 3. The non-contact wire loss detector comprises a sensor module having a line of photosensors 301. The sensor module is usually placed in the wire buffering zone (i.e., buffer zone 103 in FIG. 1). When the bonding wire 302 is fed, the looping of the wire in the buffer zone will displace (in direction 303) and trigger the photosensors 301. Detecting which sensor is triggered in the line will allow determination of the wire position and hence detection of the wire movement.

Each of the above arrangements has certain disadvantages. For a contact type wire loss detector, the detection sensitivity is quite low, because it is limited by the resolution of the encoder. Also, the inertia of the rollers will provide extra friction to the bonding wire, and will affect the consistency of looping of the wire as it is paid out during a bonding process. Moreover, due to the contact forces between the wire and the roller, the roller will tend to wear, hence causing detection inconsistency and wire contamination.

The non-contact type wire loss detector addresses most of the problems found in a contact type detector because it eliminates the contact interface between the wire and the roller. However, the detection sensitivity is still limited, because it is constrained by the sensor pitch 304 of the photosensor array 301. Accordingly, it cannot detect small wire movements.

Due to the low sensitivity of prior art detectors, sometimes wire loss detection for bonds with small wire feeds cannot be performed. For example, in a small diameter wire bonding application, the wire feeding before cutting is about the length of the bonding tool tip—of the order of a hundred microns—which usually cannot be detected.

There remains a need for a wire spool system which overcomes or alleviates at least one of the foregoing difficulties, or which at least provides a useful alternative.

SUMMARY

Certain embodiments of the invention relate to a wire spool system for a wire bonding apparatus, comprising:
 a wire reel arranged to receive a wire;
 a wire guide for feeding a free end of the wire to a bond head of the wire bonding apparatus;
 a tensioning mechanism for tensioning the wire to define a wire path between the wire reel and the wire guide; and
 an imaging module comprising a camera having an image sensor, and an image processing unit;
 wherein the camera is positioned to image, by said image sensor, at least a portion of the wire path to generate image data, and wherein the image processing unit is configured to process the image data to determine a geometry and/or a change in geometry of the at least a portion of the wire path.

By providing a camera with an image sensor, it is possible to detect small wire movements, such as wire feeding before cutting in a wedge bonding process. This allows wire loss detection to be implemented with greater accuracy than the known contact or non-contact wire loss detection mechanisms.

The wire spool may comprise a buffer region intermediate the tensioning mechanism and the wire guide, and the camera may be positioned in the buffer region.

The image data may be indicative of a first image captured prior to a movement of the bond head, and a second image captured after the movement of the bond head; and the image processing unit may be configured to determine, from said first and second images, whether the at least a portion of the wire path has moved as a result of the movement of the bond head. In certain embodiments, the image processing unit is configured to determine a length of wire which has been paid out as a result of the movement of the bond head. By comparing the wire path patterns before and after the bond head movement, the amount of fed wire can be precisely detected.

The image processing unit may be configured to determine, from said image data, a cross-sectional shape and/or diameter of the wire. Advantageously, by automatically detecting the wire diameter and/or shape, it is possible to check that the currently selected bonding parameters of the wire bonding apparatus are appropriate for the wire which is actually being used, or to automatically load suitable bonding parameters based on the measured wire characteristics.

In certain embodiments, the camera has a resolution capable of detecting wire movements of 100 µm or less.

Other embodiments of the invention relate to a method for detecting sticking of a wire bond, the method comprising steps of:

feeding a wire along a wire path to a bond head of a wire bonding apparatus;

positioning a camera such that at least a portion of the wire path is within a field of view of the camera, the camera comprising an image sensor;

after applying a wire bond with the bond head, capturing a first image of the at least a portion of the wire path;

moving the bond head;

capturing a second image of the at least a portion of the wire path; and comparing, using a pattern recognition process, the second image to the first image to determine whether the at least a portion of the wire path has moved as a result of the movement of the bond head.

Further embodiments of the invention relate to a method for determining bonding parameters for a wire bonding apparatus, the method comprising steps of:

feeding a wire along a wire path to a bond head of the wire bonding apparatus;

positioning a camera such that at least a portion of the wire path is within a field of view of the camera, the camera comprising an image sensor;

capturing an image of the at least a portion of the wire path;

determining from said image, using a pattern recognition process, a diameter and/or a cross-sectional shape of the wire; and based on the diameter and/or the cross-sectional shape, determining a wire type, and selecting bonding parameters appropriate for the wire type.

BRIEF DESCRIPTION OF THE DRAWINGS

Embodiments of the invention will now be described, by way of non-limiting example only, with reference to the accompanying drawings in which.

DETAILED DESCRIPTION

Figure 1:
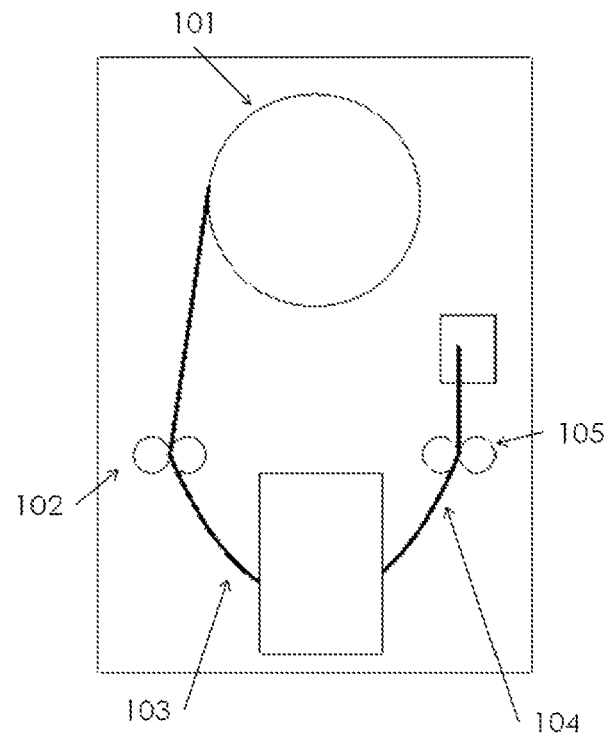
FIG. 1 is a schematic view of a known wire spool system.
Figure 2:
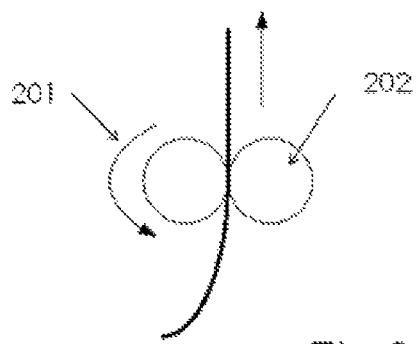
FIG. 2 and FIG. 3 depict known wire loss detection mechanisms.
Figure 3:
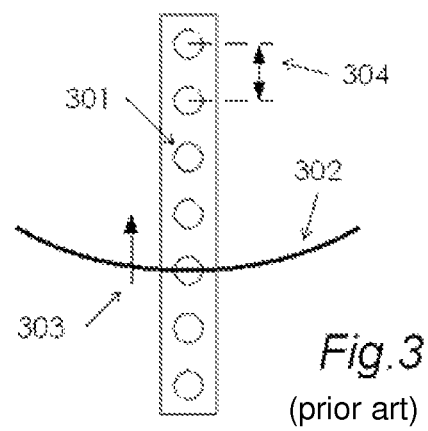
Figure 4:
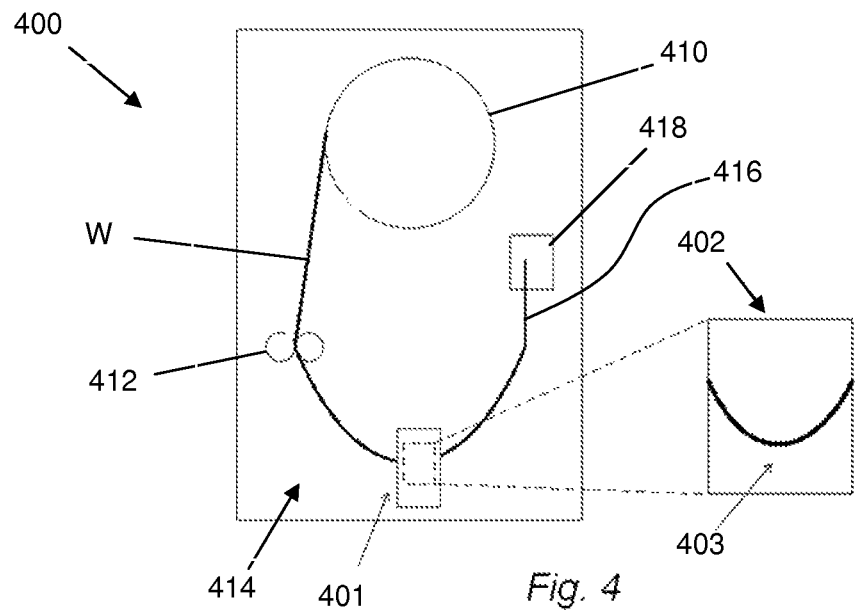
FIG. 4 is a schematic view of a wire spool system according to embodiments of the present invention.

Referring initially to FIG. 4, there is shown a wire spool system 400 having a wire reel 410 which feeds out a wire W along a wire path. The wire W passes through a tensioning mechanism in the form of tensioning rollers 412, and then to a wire guide 416 which feeds the wire to a bond head of a wire bonding apparatus (not shown) through an aperture 418 of a housing of the wire spool system 400.

Between the tensioning rollers 412 and the wire guide 416 is a buffer zone in which the wire path takes on a substantially arcuate conformation. A camera system 401 is positioned in the buffer zone along the wire path between the tensioning rollers 412 and the wire guide 416, such that at least a portion 403 of the wire path is within the field of view 402. In one embodiment, the camera system 401 is positioned with its field of view centred approximately on the lowest point of the arc. This can allow wire movement to be detected more easily.

Figure 8:
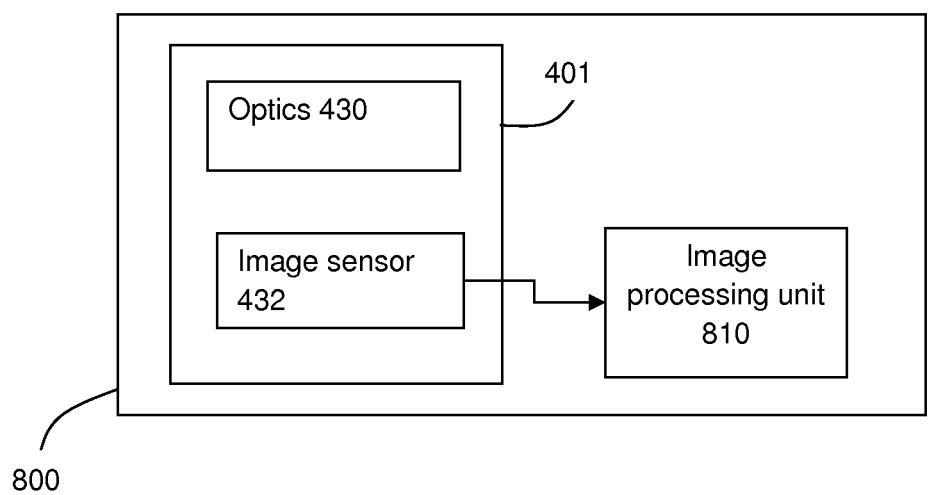
FIG. 8 shows an imaging module of a wire spool system according to embodiments of the invention.

The camera system 401 is part of an imaging module 800, which is shown in FIG. 8. The camera system 401 comprises imaging optics 430 (one or more lenses, filters, etc.) arranged in front of an image sensor 432 (e.g., a CMOS image sensor or a CCD image sensor) having an array of pixels, the outputs of which can be read out to generate image data representing an image of the portion 403 of the wire path within the field of view 402. The camera system 401 may also comprise digital signal processing electronics (not shown) for post-processing of the image data, as known in the art. In some embodiments, the camera system 401 may comprise a standard digital camera having, for example, a pixel resolution of 2650×1920 pixels. For a field of view which is 20 mm on the longer side, the detectable resolution of the system is 7.5 µm per pixel. With this resolution, small wire movements such as the wire feed conducted after the last bond in a wedge bonding sequence (which is around 100 µm) are able to be detected. In general, the wire path will be deflected by an amount equal to approximately half the bond head movement, so that, for example, a bond head movement of 100 µm will result in wire path deflection of approximately 50 µm.

The imaging module 800 also comprises an image processing unit 810, which applies one or more image processing algorithms to the image data obtained by the image sensor 432. For example, the image processing unit 810 may be configured to execute a pattern recognition process to detect an arc in the image, corresponding to the arcuate shape of the wire path 403. The pattern recognition process may parametrise the arc to determine geometric parameters of the wire path 403, such as its curvature, length, line thickness, or position within the field of view. The pattern recognition process may comprise any suitable pattern recognition algorithm, such as a standard arc detection algorithm based on the Hough transform, a shape alignment algorithm, or a binary (white/black) pattern recognition algorithm. The image processing unit 810 may be a dedicated hardware component such as an applications-specific integrated circuit (ASIC) or field-programmable gate array (FPGA). Alternatively, it may be implemented at least partly as a software module in a memory of a standard computer system which is configured to receive data from the image sensor 432. The computer system may be the same computer system which is used to control the overall operation of the wire bonding apparatus and the wire spool system 400, for example.

During a wire bonding process, the imaging module 800 may capture one or more images of the wire path 403 and analyse the one or more images to assess the bonding process.

In one embodiment, the imaging module 800 may determine whether a wire bond has stuck, based on detected wire movement. After each bond (e.g., a ball bond or a wedge bond) of a bonding process, the bond head will move away from the bonding site, in order to carry out a subsequent step in the sequence (such as looping or feed-and-cutting). If a bond is successfully made, the end of the wire will be bonded at the bond site, such that when the bond head moves, the bonding wire will feed out from the bond head. On the other hand, if the bond has not formed properly, the wire end will move away from the bond site together with the bond head and no wire feeding will occur.

In this embodiment, the camera module 401 enables bond stick detection by detecting payout of wire from the wire spool. In particular, after the bond head contacts the bond site, imaging module 800 captures a first image of the wire path, before the bond head performs its next movement. Next, the bond head moves to perform the next step in the bonding sequence, and a second image is captures by imaging module 800. The second image is then compared to the first image to determine whether the wire path has moved.

Figure 5:
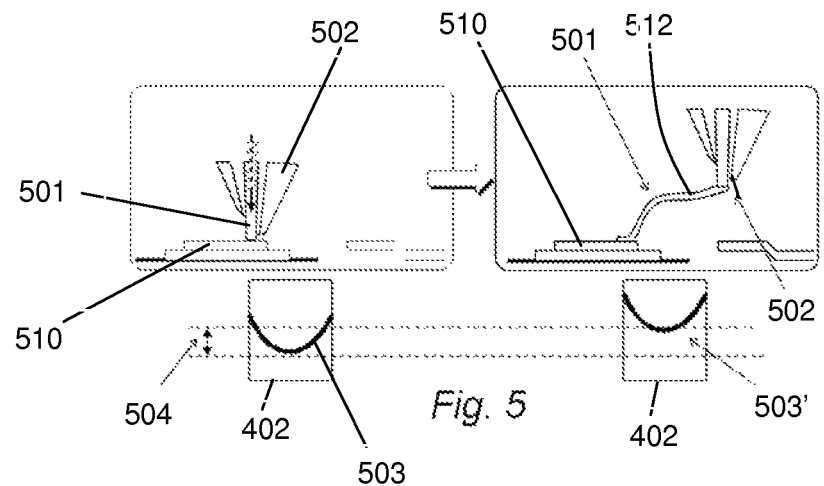
FIG. 5 illustrates image capture of a wire path during a successful wedge bonding process.

An example of a properly formed bond is illustrated in FIG. 5. In the left hand panel, the tip of bond head 502 is adjacent bond pad 510 and ultrasonic energy is transmitted along the wire 501 to form a bond at bond pad 510. A first image of the field of view 402, containing wire path 503, is captured by the imaging module 800. Since the bond is good, a length 512 of the wire is fed out from the bond head 502, thus causing the wire path 503 to move within the field of view 402, to a new position 503'. A second image of the field of view 402 is captured after the bond head movement is completed (right hand panel). The first and second images of the wire path captured before and after the move will be different. The image processing unit 810 can determine the amount 504 of wire movement by calculating the difference in wire position from the first and second images. If the difference exceeds a predetermined threshold, the image processing unit 810 determines that wire has been fed out and that the bond has therefore been properly formed. The threshold can be an absolute or relative amount (e.g., 10% of the wire length), and can be selected according to user preference. The wire length which should be fed out during a programmed bonding movement can be estimated by the control software for the bond head from the trajectory which the bond head is meant to follow during the programmed movement. For example, to create a wire loop between two bonding points the bond head must follow a predetermined curved trajectory, and the control software may estimate the wire length based on the predetermined trajectory.

Figure 6:
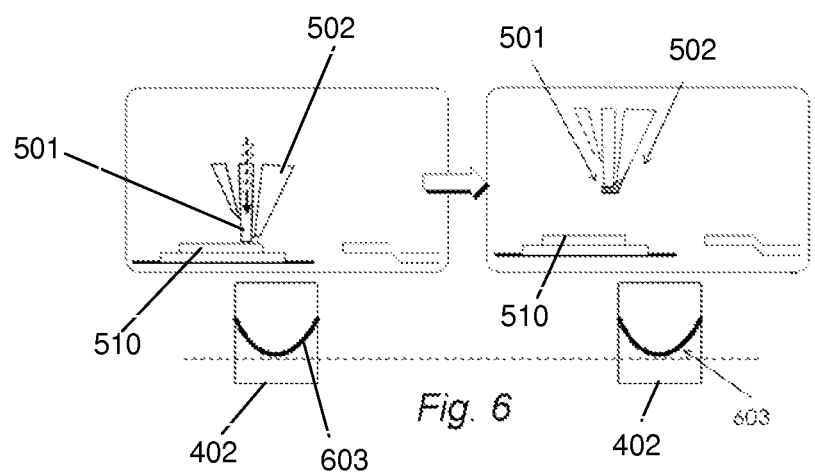
FIG. 6 illustrates image capture of a wire path during a wedge bond failure.

On the other hand, if the bond has not formed properly, as shown in FIG. 6, the wire end 601 will move with the bond head 602 without any feed out of wire occurring, and hence the position 603 of the wire path within the field of view 402 will remain unchanged. The images captured before and after the bond head move will be substantially the same and no difference will be found by the image processing unit 810.

Figure 7:
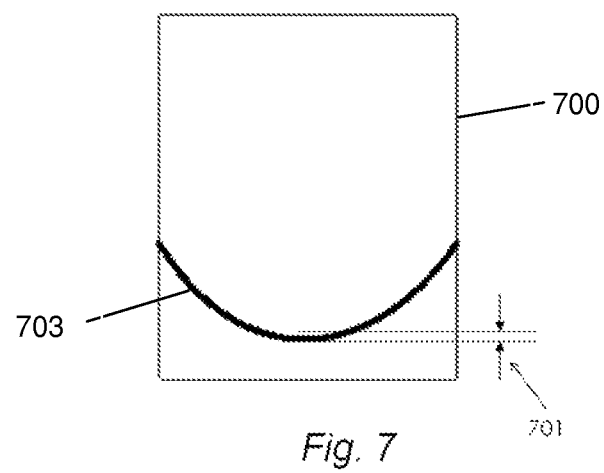
FIG. 7 illustrates determination of wire geometry by a wire spool system according to embodiments of the invention.

In another embodiment, parameters of the bonding wire, such as the geometric parameters of the wire, can be determined by analyzing a single image 700 captured by imaging module 800. FIG. 7 shows an example image taken by the camera module 401. From the image 700, the image processing unit 810 can identify the wire path 703, and from that, determine geometric parameters such as diameter 701, or cross-sectional shape (e.g., ribbon wire or round wire). The information relating to the geometric parameters enables the bonding apparatus to determine which type of bonding wire has been installed, and automatically load the bonding parameters appropriate to that type of wire, and/or to check any user-input parameters to ensure that they are appropriate to the detected type of wire, thereby avoiding human errors.

Although particular embodiments of the invention have been described in detail, many modifications and variations are possible within the scope of the invention, as will be clear to a skilled reader.

The invention claimed is:

1. A wire spool system for a wire bonding apparatus, comprising:
 a wire reel arranged to receive a wire;
 a wire guide for feeding a free end of the wire to a bond head of the wire bonding apparatus;
 a tensioning mechanism for tensioning the wire to define a wire path between the wire reel and the wire guide; and
 an imaging module comprising a camera having an image sensor, and an image processing unit;
 wherein the camera is positioned to image, by said image sensor, at least a portion of the wire path between the wire reel and the wire guide to generate image data, and wherein the image processing unit is configured to process the image data to determine a geometry and/or a change in geometry of the at least a portion of the wire path between the wire reel and the wire guide.

2. A wire spool system for a wire bonding apparatus comprising:
 a wire reel arranged to receive a wire;
 a wire guide for feeding a free end of the wire to a bond head of the wire bonding apparatus;
 a tensioning mechanism for tensioning the wire to define a wire path between the wire reel and the wire guide;
 an imaging module comprising a camera having an image sensor, and an image processing unit;
 wherein the camera is positioned to image, by said image sensor, at least a portion of the wire path to generate image data, and wherein the image processing unit is configured to process the image data to determine a geometry and/or a change in geometry of the at least a portion of the wire path; and
 a buffer region intermediate the tensioning mechanism and the wire guide, wherein the camera is positioned in the buffer region.

3. A wire spool system for a wire bonding apparatus, comprising:
 a wire reel arranged to receive a wire;
 a wire guide for feeding a free end of the wire to a bond head of the wire bonding apparatus;
 a tensioning mechanism for tensioning the wire to define a wire path between the wire reel and the wire guide; and
 an imaging module comprising a camera having an image sensor, and an image processing unit;
 wherein the camera is positioned to image, by said image sensor, at least a portion of the wire path to generate image data, and wherein the image processing unit is configured to process the image data to determine a geometry and/or a change in geometry of the at least a portion of the wire path; and wherein the image data are indicative of a first image captured prior to a movement of the bond head, and a second image captured after the movement of the bond head; and wherein the image processing unit is configured to determine, from said first and second images, whether the at least a portion of the wire path has moved as a result of the movement of the bond head.

4. A wire spool system according to claim 3, wherein the image processing unit is configured to determine a length of wire which has been paid out as a result of the movement of the bond head.

5. A wire spool system for a wire bonding apparatus, comprising:
a wire reel arranged to receive a wire;
a wire guide for feeding a free end of the wire to a bond head of the wire bonding apparatus;
a tensioning mechanism for tensioning the wire to define a wire path between the wire reel and the wire guide; and
an imaging module comprising a camera having an image sensor, and an image processing unit;
wherein the camera is positioned to image, by said image sensor, at least a portion of the wire path to generate image data, and wherein the image processing unit is configured to process the image data to determine a geometry and/or a change in geometry of the at least a portion of the wire path; and
wherein the image processing unit is configured to determine, from said image data, a cross-sectional shape and/or diameter of the wire.

6. A wire spool system according to claim 1, wherein the camera has a resolution capable of detecting a wire movement of 100 μm or less.

* * * * *